(12) United States Patent
Li et al.

(10) Patent No.: US 11,581,185 B2
(45) Date of Patent: Feb. 14, 2023

(54) FIELD EFFECT TRANSISTOR USING TRANSITION METAL DICHALCOGENIDE AND A METHOD FOR FORMING THE SAME

(71) Applicant: TAIWAN SEMICONDUCTOR MANUFACTURING COMPANY, LTD., Hsinchu (TW)

(72) Inventors: Ming-Yang Li, Hsinchu (TW); Lain-Jong Li, Hsinchu (TW); Chih-Piao Chuu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 68 days.

(21) Appl. No.: 17/346,712

(22) Filed: Jun. 14, 2021

(65) Prior Publication Data
US 2021/0305046 A1  Sep. 30, 2021

Related U.S. Application Data

(63) Continuation of application No. 16/415,463, filed on May 17, 2019, now Pat. No. 11,037,783.
(Continued)

(51) Int. Cl.
*H01L 21/02* (2006.01)
*H01L 29/10* (2006.01)
(Continued)

(52) U.S. Cl.
CPC .... *H01L 21/02568* (2013.01); *H01L 21/0262* (2013.01); *H01L 21/02433* (2013.01);
(Continued)

(58) Field of Classification Search
CPC ......... H01L 21/02568; H01L 21/02433; H01L 21/0262; H01L 21/02639;
(Continued)

(56) References Cited

U.S. PATENT DOCUMENTS

| 2011/0147840 A1 | 6/2011 | Cea et al. |
| 2017/0005197 A1 | 1/2017 | Xiao |

(Continued)

FOREIGN PATENT DOCUMENTS

| CN | 104846434 A | 8/2015 |
| CN | 106898542 A | 6/2017 |

(Continued)

OTHER PUBLICATIONS

Jing-Kai Huang, Jiang Pu, Chang-Lung Hsu, Ming-Hui Chiu, Zhen-Yu Juang, Yung-Huang Chang, Wen-Hao Chang, Yoshihiro Iwasa, Taishi Takenobu, and Lain-Jong Li, "Large-Area Synthesis of Highly Crystalline WSe2 Monolayers and Device Applications," ACS Nano, vol. 8, No. 1, 923-930 (2014).

(Continued)

*Primary Examiner* — Joseph C. Nicely
(74) *Attorney, Agent, or Firm* — McDermott Will & Emery LLP

(57) ABSTRACT

In a method of forming a two-dimensional material layer, a nucleation pattern is formed over a substrate, and a transition metal dichalcogenide (TMD) layer is formed such that the TMD layer laterally grows from the nucleation pattern. In one or more of the foregoing and following embodiments, the TMD layer is single crystalline.

20 Claims, 8 Drawing Sheets

Related U.S. Application Data

(60) Provisional application No. 62/736,335, filed on Sep. 25, 2018.

(51) Int. Cl.
*H01L 29/786* (2006.01)
*H01L 29/24* (2006.01)
*H01L 29/66* (2006.01)
*H01L 29/778* (2006.01)
*H01L 21/8234* (2006.01)

(52) U.S. Cl.
CPC .......... *H01L 21/02639* (2013.01); *H01L 21/823412* (2013.01); *H01L 29/1033* (2013.01); *H01L 29/24* (2013.01); *H01L 29/66969* (2013.01); *H01L 29/778* (2013.01); *H01L 29/78681* (2013.01)

(58) Field of Classification Search
CPC ......... H01L 21/823412; H01L 29/1033; H01L 29/24; H01L 29/66969; H01L 29/778; H01L 29/78681
See application file for complete search history.

(56) References Cited

U.S. PATENT DOCUMENTS

| | | |
|---|---|---|
| 2017/0098717 A1 | 4/2017 | Yeh et al. |
| 2017/0178905 A1 | 6/2017 | Delabie et al. |
| 2018/0105930 A1 | 4/2018 | Kang et al. |
| 2018/0151755 A1 | 5/2018 | Hou et al. |
| 2018/0166550 A1 | 6/2018 | Rodder et al. |
| 2018/0175196 A1 | 6/2018 | Chen et al. |
| 2019/0067284 A1 | 2/2019 | Ching et al. |
| 2019/0164754 A1 | 5/2019 | Kim et al. |
| 2020/0066917 A1 | 2/2020 | Kula et al. |
| 2020/0091306 A1 | 3/2020 | Heo et al. |

FOREIGN PATENT DOCUMENTS

| | | |
|---|---|---|
| CN | 107546128 A | 1/2018 |
| JP | 2017-079313 A | 4/2017 |
| KR | 20180011899 A | 2/2018 |

OTHER PUBLICATIONS

Brian M. Bersch et al., "Selective-are growth and controlled substrate coupling of transition metal dichalcogenides," 2D Mater. 4 025083 (2017).

Xiao Zhang et al., "Novel structured transition metal dichalcogenide nanosheets," Chem. Soc. Rev. vol. 47, pp. 3301-3338 (2018).

Xi Ling et al., "Parallel Stitching of 2D Materials," Advanced Materials, vol. 28, pp. 2322-2329 (2016).

Non-Final Office Action issued in U.S. Appl. No. 16/415,463, dated Jul. 6, 2020.

Final Office Action issued in U.S. Appl. No. 16/415,463, dated Nov. 3, 2020.

Notice of Allowance issued in U.S. Appl. No. 16/415,463, dated Feb. 12, 2021.

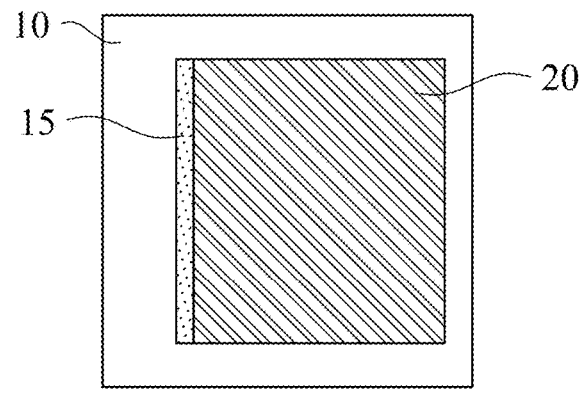
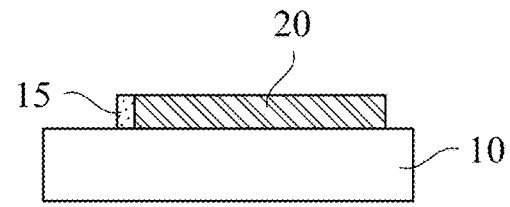
FIG. 3A  FIG. 3B
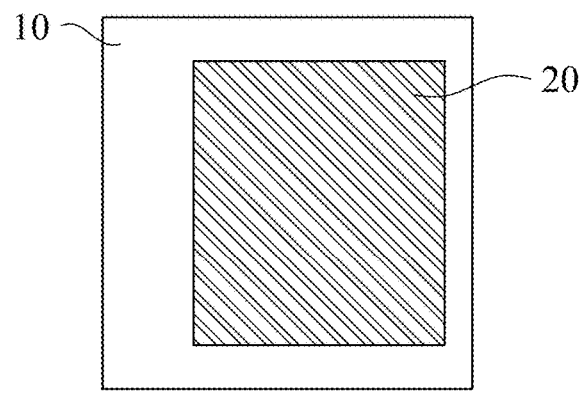
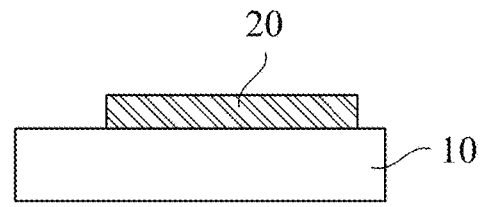
FIG. 4A  FIG. 4B
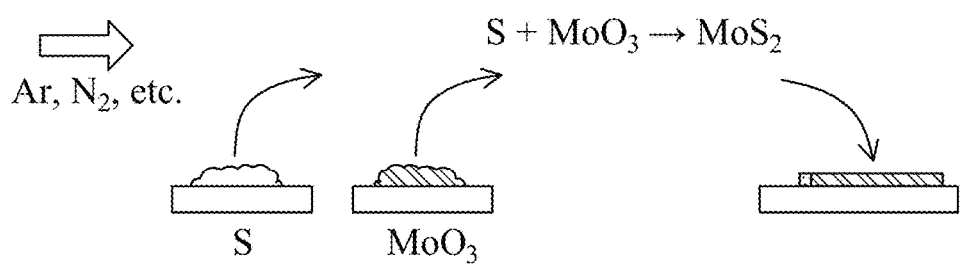
FIG. 5

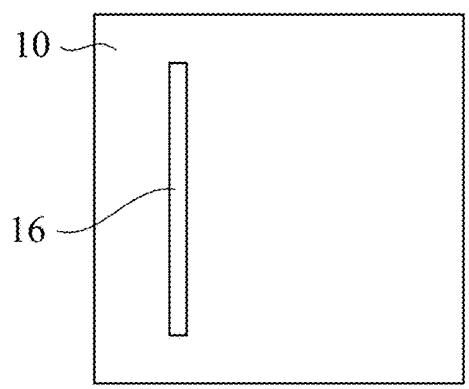
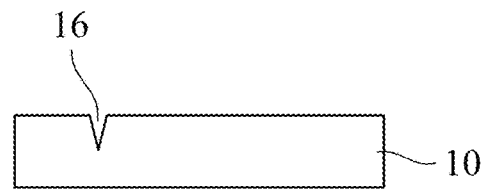
FIG. 7A    FIG. 7B
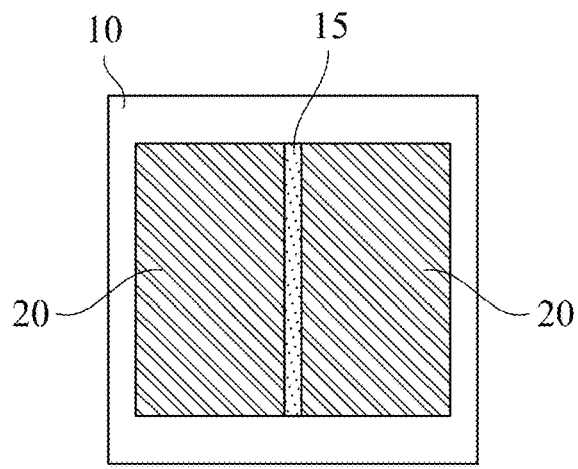
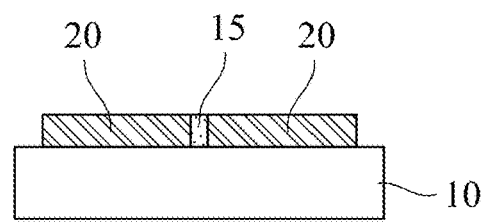
FIG. 8A    FIG. 8B
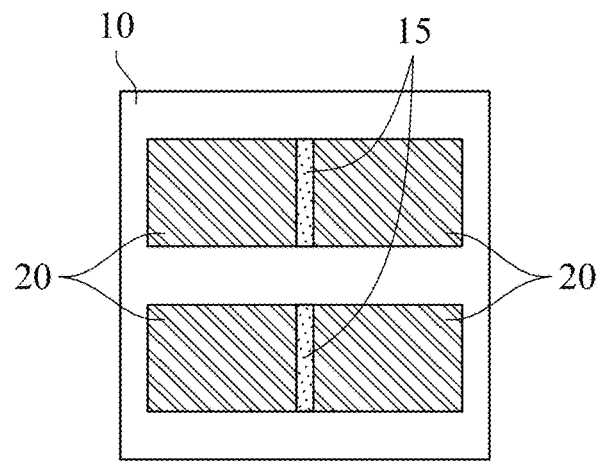
FIG. 8C

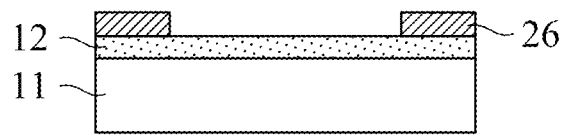
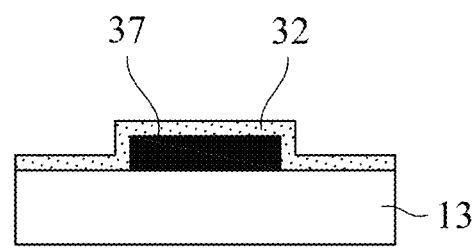
FIG. 13A    FIG. 14A
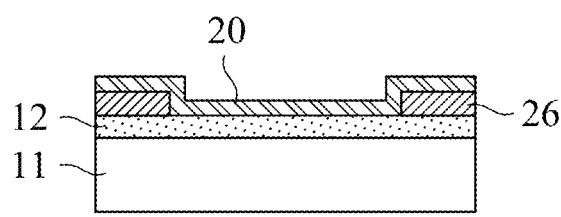
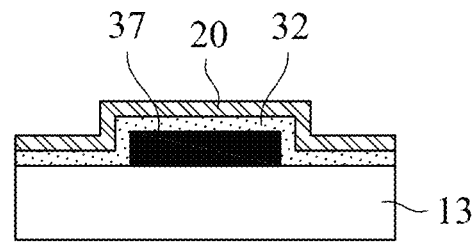
FIG. 13B    FIG. 14B
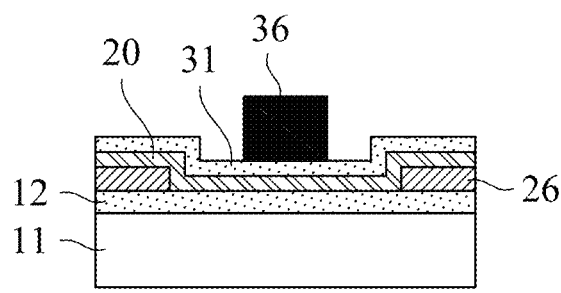
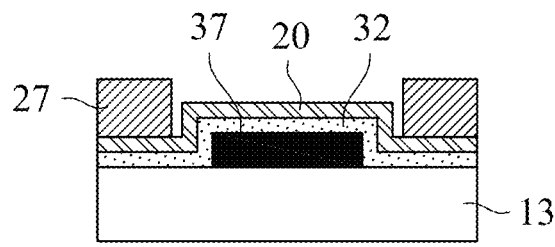
FIG. 13C    FIG. 14C

FIELD EFFECT TRANSISTOR USING TRANSITION METAL DICHALCOGENIDE AND A METHOD FOR FORMING THE SAME

RELATED APPLICATIONS

This application is a continuation of U.S. patent application Ser. No. 16/415,463 filed on May 17, 2019, now U.S. Pat. No. 11,037,783, which claims priority of U.S. Provisional Patent Application No. 62/736,335 filed on Sep. 25, 2018, the entire contents of each of which are incorporated herein by reference.

BACKGROUND

Graphene, as a two-dimensional (2-D) material, has emerged as a possible material for transistor applications in a sub-10 nm technology node. However, due to its zero-bandgap nature, a low ON/OFF ratio of graphene transistors has limited its practical applications. Other 2-D materials with bandgaps, such as transition metal dichalcogenide (TMD), have attracted attention for transistor applications.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A and 3B show one of the stages of a sequential process for manufacturing a single crystalline TMD layer according to an embodiment of the present disclosure.

FIGS. 4A and 4B show one of the stages of a sequential process for manufacturing a single crystalline TMD layer according to an embodiment of the present disclosure.

FIG. 5 shows a schematic view of a manufacturing process and apparatus for forming a TMD layer according to an embodiment of the present disclosure.

FIGS. 7A and 7B show one of the stages of a sequential process for manufacturing a single crystalline TMD layer according to an embodiment of the present disclosure.

FIGS. 8A, 8B and 8C show one of the stages of a sequential process for manufacturing a FET using a single crystalline TMD layer according to an embodiment of the present disclosure.

FIGS. 13A, 13B and 13C show various stages of a sequential process for manufacturing a FET using a single crystalline TMD layer according to an embodiment of the present disclosure.

FIGS. 14A, 14B and 14C show various stages of a sequential process for manufacturing a FET using a single crystalline TMD layer according to an embodiment of the present disclosure.

DETAILED DESCRIPTION

Figure 1A:
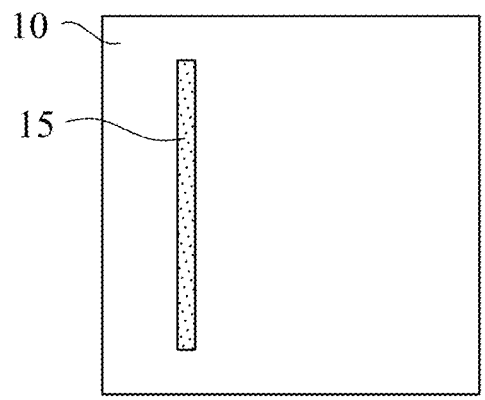
FIGS. 1A and 1B show one of the stages of a sequential process for manufacturing a single crystalline TMD layer according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device/apparatus may be otherwise oriented (rotated 90 degrees or at other orientations) and the spatially relative descriptors used herein may likewise be interpreted accordingly. In addition, the term "made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

A mono-layer of transition metal dichalcogenides (TMDs), represented by $MX_2$, where M=Mo, W, Pd, Pt, and/or Hf, and X=S, Se and/or Te, is known as a two-dimensional (2D) semiconducting layer which can be used as an active transistor channel. Here, a "2D" layer generally refers to one or a few layers of an atomic matrix or a network having thickness within the range of about 0.1-5 nm, in some embodiments.

The mono layer of the TMDs can be formed over a substrate using chemical vapor deposition (CVD) or vapor phase growth. However, the TMD layer thus grown results in a polycrystalline film, where orientations of each domain are randomly arranged, and grain boundaries are formed at the interfaces of adjacent mis-oriented domains. Such grain boundary defects may cause many in-gap trapping states, which are detrimental to high performance transistor applications. In the present disclosure, fabrication methods to obtain a larger area single crystalline TMD mono layer are disclosed.

In some embodiments of the present disclosure, a nucleation pattern (nucleation site) for controlling crystallinity of the grown TMD mono layer is employed. For example, a line-shape pattern of a metal or metal oxide thin layer or a line-shape defect (e.g., scratch, groove or recess) is created on a growth substrate. The edge of these patterns can serve as the nucleation site, which initiate the growth of the TMD mono layer.

In addition, in some embodiments of the present disclosure, a suitable orientation of the surface of the substrate, on which the TMD mono layer is formed, is selected to control symmetry between the substrate and a lattice structure of the TMD mono layer. The selection of the right substrates allows the growth of substantially perfectly aligned grains, which results in a single crystalline layer without grain boundaries.

FIGS. 1A-4B shows a sequential process for manufacturing a single crystalline TMD layer according to an embodiment of the present disclosure. It is understood that additional operations can be provided before, during, and after processes shown by FIGS. 1A-4B, and some of the operations described below can be replaced or eliminated, for additional embodiments of the method. The order of the operations/processes may be interchangeable. In FIGS. 1A-4B, the "A" figures are cross sectional views and the "B" figures are plan views (top views).

Figure 1B:
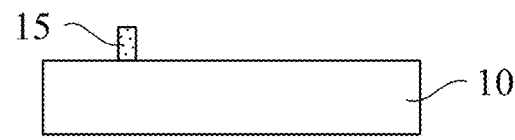

As shown in FIGS. 1A and 1B, a nucleation pattern 15 is formed over a substrate 10. In some embodiments, a metal layer or a metal oxide layer is formed on the substrate 10, and by using one or more lithography and etching operations, a line pattern 15 is formed. In some embodiments, the metal is Mo and the metal oxide is $MoO_3$. In other embodiments, W, Pd, Pt or Hf or an oxide thereof is used as the metal layer or the metal oxide layer for the line pattern 15. In certain embodiments, metal M or an oxide of metal M is used for growth of $MX_2$. Other materials can be used.

The metal layer or the metal oxide layer can be formed by CVD, physical vapor deposition (PVD) or any other suitable film formation methods. In some embodiments, a thickness of the metal layer or the metal oxide layer is in a range from about 20 nm to about 200 nm and is in a range from about 50 nm to about 100 nm in other embodiments. In some embodiments, a width of the nucleation pattern 15 is in a range from about 50 nm to about 500 nm and is in a range from about 100 nm to about 200 nm in other embodiments. In other embodiments, the nucleation pattern 15 is a rectangular shape or a square shape. A length of the nucleation pattern depends on the desired size of the TMD layer. In some embodiments, the length of the nucleation pattern 15 is in a range from about 1 μm to about 100 mm and is in a range from about 100 μm to about 10 mm in other embodiments.

Then, source materials, such as source gases, are provided over the substrate 10 with the nucleation pattern 15. In a case of CVD for forming a $MoS_2$ layer, a $Mo(CO)_6$ gas, a $MoCl_5$ gas, and/or a $MoOCl_4$ gas are used as a Mo source, and a $H_2S$ gas and/or a dimethylsulfide gas are used as a S source, in some embodiments. In other embodiments, a $MO_3$ gas sublimed from a solid $MO_3$ or a $MoCl_5$ source and/or S gas sublimed from a solid S source can be used, as shown in FIG. 5. As shown in FIG. 5, solid sources of Mo and S are placed in a reaction chamber and a carrier gas containing inert gas, such as Ar, $N_2$ and/or He flows in the reaction chamber. The solid sources are heated to generate gaseous sources by sublimation, and the generated gaseous sources react to form $MoS_2$ molecules. The $MoS_2$ molecules are then deposited on the substrate. The substrate is appropriately heated in some embodiments. In other embodiments, the entire reaction chamber is heated by induction heating. Other TMD layers can also be formed by CVD using suitable source gases. For example, metal oxides, such as $WO_3$, $PdO_2$ and $PtO_2$ can be used as a sublimation source for W, Pd and Pt, respectively, and metal compounds, such as $W(CO)_6$, $WF_6$, $WOCl_4$, $PtCl_2$ and $PdCl_2$ can also be used as a metal source.

Figure 2A:
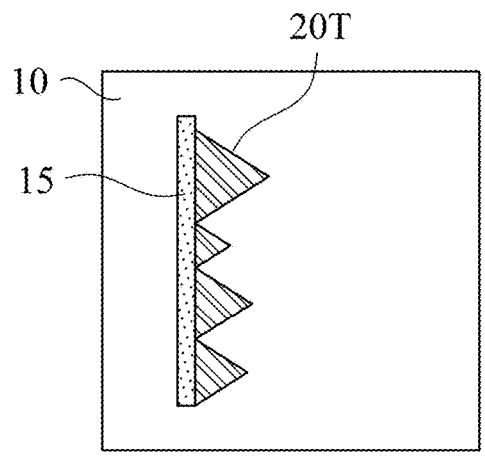
FIGS. 2A and 2B show one of the stages of a sequential process for manufacturing a single crystalline TMD layer according to an embodiment of the present disclosure.
Figure 2B:
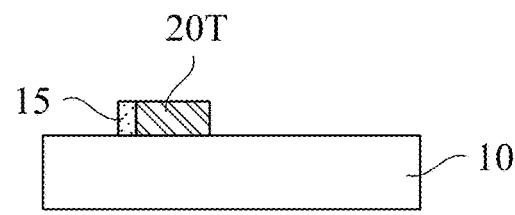
Figure 2C:
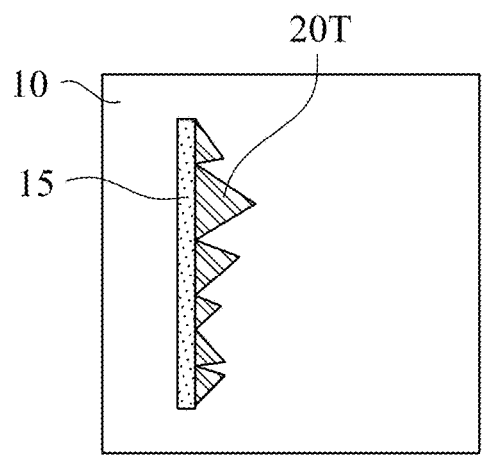
FIG. 2C shows one of the stages of a sequential process for manufacturing a TMD layer.

Due to lower nucleation energy at the edge of the nucleation pattern 15, triangle shape layers 20T of TMD ($MX_2$) crystal begin to nucleate at the edge of the nucleation pattern 15, as shown in FIGS. 2A and 2B. In particular, when the main surface (upper surface) of the substrate 10 (e.g., Si) has (110) orientation, the triangle shape layers 20T of TMD are aligned to the orientation of substrate 10. In contrast, when the substrate 10 is, for example, silicon oxide, the triangle shape layers 20T of TMD are randomly oriented, forming a poly crystalline layer, as shown in FIG. 2C.

A thickness of the TMD single crystalline layer 20 is in a range from about 0.6 nm to about 2 nm in some embodiments. By continuing the formation of the TMD layer, a large area single crystalline structure 20 is obtained as shown in FIGS. 3A and 3B. In some embodiments, after the desired size of the TMD single crystalline layer 20 is obtained, the nucleation pattern 15 is removed by using suitable etching operations, such as wet etching, as shown in FIGS. 4A and 4B. A thickness of the TMD single crystalline layer 20 is in a range from about 0.5 nm to about 2 nm in some embodiments.

Figure 15:
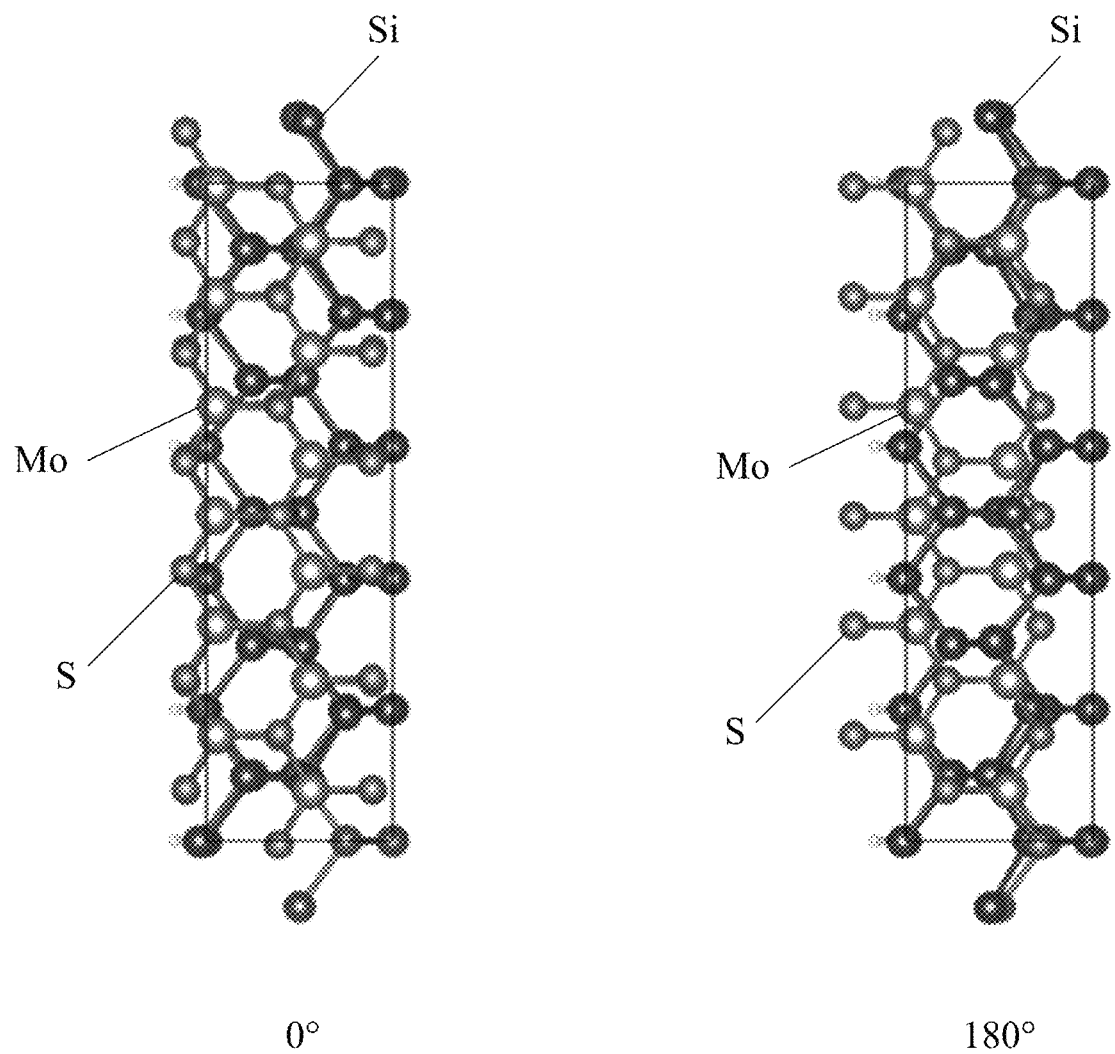
FIG. 15 shows a two orientations (0° and 180°) of $MoS_2$ monolayer on Si (110) substrate.

In some embodiments of the present disclosure, as set forth above, suitable substrates are selected to control the growth of the TMD layer. The use of the substrate with a different lattice symmetry can limit the growth orientation of the TMD materials. For example, the substrate in a $C_2$ symmetry group is able to guide and limit the orientation of the TMD layer in a $C_3$ symmetry group. In some embodiments, the substrate 10 is a crystalline substrate having a $C_2$ symmetry at its main surface. In certain embodiments, one of Si (110), γ-$Al_2O_3$ (110), $Ga_2O_3$ (010) and MgO (110) is used as the substrate 10. To further illustrate the effect, FIG. 15 shows two possible orientations (0° and 180°) of $MoS_2$ monolayer on Si (110) substrate. Simulation results based on the density functional theory show that these two orientations will not have energy difference when $MoS_2$ layers are free-standing or on amorphous substrates. After the $MoS_2$ monolayer is grown on the Si (110) substrate, the energy barrier per area for 0° and 180° phase separation is around 4 meV/Å$^2$ (with LDA exchange functional), which is high enough to lead to preferred single-orientation (0°) during the growth.

In other embodiments, a layer of hexagonal boron nitride (h-BN) or graphene is formed over a substrate 10. The $MX_2$ crystals have a hexagonal lattice structure, which lattice-matches well with hexagonal boron nitride (h-BN) or graphene for lateral growth. When the intermediate layer of h-BN or graphene is used, the $MX_2$ 2D materials can still be affected by the underlying substrate 10 because the atomic-thin layer of h-BN or graphene is very thin.

In some embodiments, a composite substrate such as a layer of h-BN or graphene substrate deposited on top of a $C_3$ symmetry substrate, such as SiC (0001) or Ge (111), or Si (111), Cu (111) or Pt (111). Since the h-BN or graphene strongly interacts with the underlying substrate to form a Moiré pattern, in which the overall symmetry of the composite substrate, such as h-BN/SiC(0001) or h-BN/Si(111), graphene/SiC(0001), graphene/Ge(111) or the like, is reduced. In this case, the composite substrate can guide the orientation of 2D layers toward single orientation.

Figure 6:
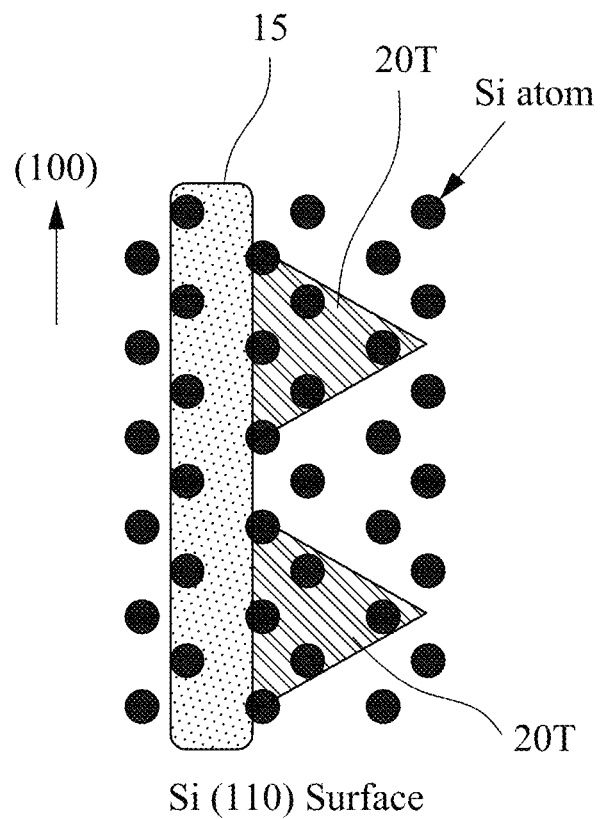
FIG. 6 shows nucleation of a TMD layer according to an embodiment of the present disclosure.

FIG. 6 shows nucleation of the TMD ($MX_2$) layer. As shown in FIG. 6, the main surface (upper surface) of the substrate (e.g., Si) has (110) orientation. The nucleation pattern 15 extends in a direction corresponding to a (100) face of the Si substrate 10. As shown in FIG. 6, small triangles of a $MX_2$ mono layer start to grow from the edge of the nucleation pattern 15. The surface lattice structure of the Si (110) substrate can control the $MX_2$ triangular flakes 20T (small crystalline mono layer pieces) to orient to the same direction which gives the lowest system energy as shown in FIGS. 3A and 3B. Such well aligned flakes eventually merge as a large-area single crystalline film 20, without grain boundaries, as shown in FIGS. 3A and 3B. In some embodiments, an area greater than 1 mm×1 mm (up to, for example, 10 mm×10 mm) can be obtained.

If there is no nucleation pattern on the substrate 10, triangle shape layers are randomly generated at different locations. Meanwhile, the edge of the nucleation pattern further helps to guide the crystal orientations. However, in the case there is no suitable substrate for example, a $SiO_2$ substrate, although the nucleation starts at the edges of the nucleation pattern, the orientation of the triangular flakes is random, and thus a single crystalline layer is not obtained, as shown in FIG. 3C.

FIGS. 7A and 7B shows a line defect 16 formed on the surface of the substrate 10. In some embodiments, the line defect 16 is a groove. The shape of groove can be a V-shape or a U-shape. The line defect 16 can be formed by one or more lithography and etching operations, mechanical scratching by a diamond tip or by laser etching. A depth of the line defect is in a range from about 20 nm to about 1000 nm and is in a range from about 100 nm to about 500 nm in other embodiments. The line defect 16 substantially functions as a nucleation pattern similar to pattern 15 shown in FIGS. 1A-3B and 6.

In FIGS. 2A, 2B, 3A and 3B, the single crystalline TMD layer 20 is formed at only one side of the nucleation pattern 15. However, in other embodiments, the single crystalline TMD layer 20 is formed at both sides of the nucleation pattern 15 as shown in FIGS. 8A and 8B. In some embodiments, a TMD layer is also formed over the nucleation pattern 15.

Further, in some embodiments, as shown in FIG. 8C, a plurality of (two or more) nucleation patterns 15 are formed over the substrate 10, and multiple regions of a single crystalline TMD layer 20 are formed.

FIGS. 9A-11B shows a sequential process for manufacturing a field effect transistor (FET) using a single crystalline TMD layer according to an embodiment of the present disclosure. It is understood that additional operations can be provided before, during, and after processes shown by FIGS. 9A-11B, and some of the operations described below can be replaced or eliminated, for additional embodiments of the method. The order of the operations/processes may be interchangeable. In FIG. 9A-11B, the "A" figures are cross sectional views and the "B" figures are plan views (top views). Materials, configurations, structures, operations and/or processes the same as or similar to the foregoing embodiments may be employed in this embodiment and the detailed explanation may be omitted. In the following embodiments, an FET is formed over a semiconductor substrate, such as a (110) Si substrate.

Figure 9A:
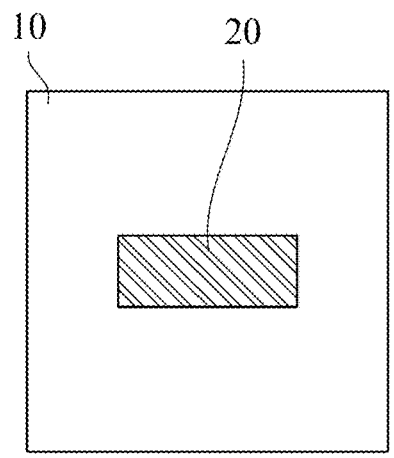
FIGS. 9A and 9B show one of the stages of a sequential process for manufacturing a FET using a single crystalline TMD layer according to an embodiment of the present disclosure.
Figure 9B:
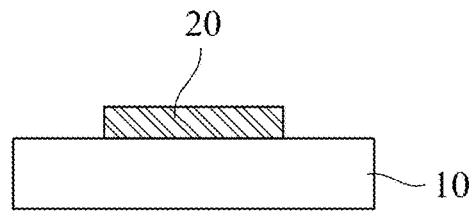

After the large area of the TMD single crystalline layer 20 is formed as shown in FIGS. 4A and 4B, the TMD single crystalline layer 20 is trimmed by using one or more lithography and etching operations, as shown in FIGS. 9A and 9B.

Figure 10A:
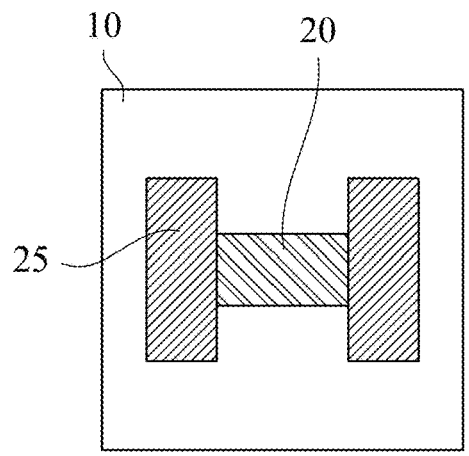
FIGS. 10A and 10B show one of the stages of a sequential process for manufacturing a FET using a single crystalline TMD layer according to an embodiment of the present disclosure.
Figure 10B:
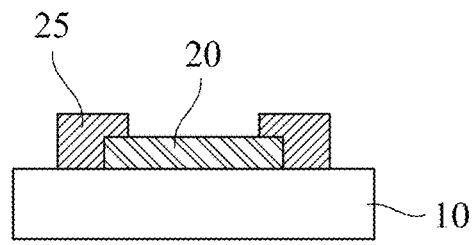

Then, as shown in FIGS. 10A and 10B, source/drain electrodes 25 are formed over part of the TMD single crystalline layer 20. The source/drain electrodes 25 are made of one or more layers of metal material. In some embodiments, the source/drain electrodes 25 are formed by stacked metal layers of a Ti layer and an Au layer formed on the Ti layer. In certain embodiments, the thickness of the Au layer is in a range from about 30 nm to about 70 nm and the thickness of the Ti layer is in a range from about 3 nm to about 10 nm. Instead of Au, other metals, such as Ag, Al or Cu may be used. The one or more metal layers for the source/drain electrodes 25 may be formed by PVD, CVD or ALD, and one or more lithography and etching operations. In other embodiments, other conductive materials, such as W, Ti, Co, Ni, Ta, TiN, TiAl, TiAlN, TaN, NiSi or CoSi, and other conductive materials can be used for the source/drain electrode 25. In some embodiments, the source/drain electrodes 25 are formed only over the TMD layer 20 and are not in contact with the substrate 10.

Figure 11A:
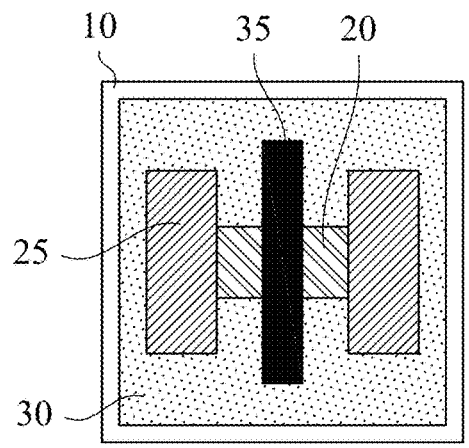
FIGS. 11A and 11B show one of the stages of a sequential process for manufacturing a FET using a single crystalline TMD layer according to an embodiment of the present disclosure.
Figure 11B:
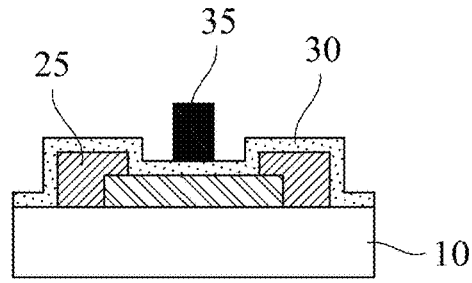

Further, as shown in FIGS. 11A and 11B, a gate dielectric layer 30 is formed over the TMD single crystalline layer 20 and a gate electrode 35 is formed on the gate dielectric layer 30. The gate dielectric layer 30 is made of, for example, silicon oxide, aluminum oxide, $HfO_2$, $ZrO_2$, SiON or silicon nitride, formed by using CVD, ALD or PVD. The thickness of the gate dielectric layer 30 is in a range from about 5 nm to about 200 nm in some embodiments, and is in a range from about 10 nm to about 50 nm in other embodiments. The gate electrode 35 is made of, for example, poly silicon or metal material, such as Ti, Ta, Cu, or Al. A blanket layer of conductive material is deposited by CVD, ALD or PVD on the gate dielectric layer 30, and patterning operations are performed to obtain the desired gate electrode pattern. Subsequently, one or more dielectric layers are formed over the gate electrode 35 and the remaining structures and contacts to the gate electrode 35 and the source/drain electrodes 25 (not shown) are formed. The width of the gate electrode 35 in the source-drain direction is in a range from about 5 nm to about 50 nm in some embodiments, and is in a range from about 10 nm to about 30 nm in other embodiments.

When the multiple regions of the TMD layer 20 as shown in FIG. 8C are used, multiple FETs are formed in the multiple regions, respectively.

FIGS. 12A-12E shows a sequential process for manufacturing a single crystalline TMD layer according to an embodiment of the present disclosure. It is understood that additional operations can be provided before, during, and after processes shown by FIGS. 12A-12E, and some of the operations described below can be replaced or eliminated, for additional embodiments of the method. The order of the operations/processes may be interchangeable. Materials, configurations, structures, operations and/or processes the same as or similar to the foregoing embodiments may be employed in this embodiment and the detailed explanation may be omitted.

In the following embodiments, a single crystalline TMD layer is formed over a dummy (first) substrate and then transferred to a device substrate for fabrication of FETs.

Figure 12A:
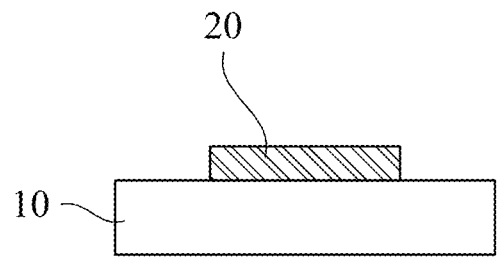
FIGS. 12A, 12B, 12C, 12D and 12E show various stages of a sequential process for manufacturing a single crystalline TMD layer according to an embodiment of the present disclosure.

According to the operations explained with respect to FIGS. 1A-4B, a single crystalline TMD layer 20 is formed over a first substrate 10, as shown in FIG. 12A. The first substrate is one of γ-Al$_2$O$_3$ (110), Ga$_2$O$_3$ (110) and MgO (110) in some embodiments. In other embodiments, a (110) Si substrate is used.

Figure 12B:
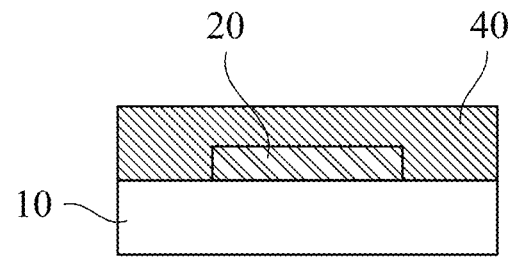
Figure 12C:
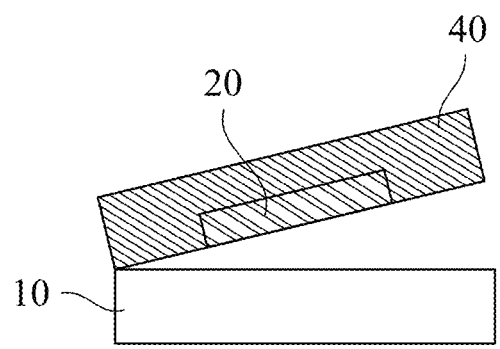
Figure 12D:
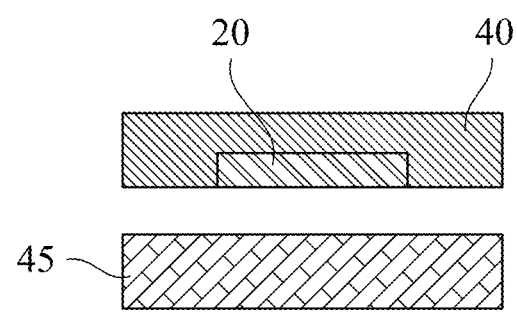

Then, as shown in FIG. 12B, a stamp layer 40 is formed over the TMD layer 20 and the first substrate 10, instead of PDMS. In some embodiments, the stamp layer 40 is made of polydimethylsiloxane (PDMS). A layer of PDMS is pressed onto the TMD layer 20 and then the PDMS stamp layer 40 is peeled as shown in FIG. 12C. Due to strong adhesion between the TMD layer 20 and the PDMS stamp layer 40, the TMD layer 20 is also peeled off from the first substrate 10 together with the PDMS stamp layer 40. In some embodiments, the structure of FIG. 12B is immersed in deionized water and the first substrate 10 is detached. Ultrasonic vibrations may be applied to the water.

In other embodiments, a polymer solution containing polymethylmethacrylate (PMMA) is spin-coated over the TMD layer 20 and the first substrate 10, as shown in FIG. 12B. Then, the PMMA stamp layer 40 is dried and cured in some embodiments. The curing process includes thermal curing, UV curing, electron beam curing or the combination thereof. In some embodiments, the PMMA stamp layer 40 is mechanically peeled off from the first substrate 10 together with the TMD layer 20. In other embodiments, the substrate 10 is wet etched, thereby releasing the PMMA stamp layer 40 with the TMD layer 20. When the substrate 10 is thick, a grinding operation to remove the bulk portion of the substrate 10 from the rear side of the substrate 10 and then a wet-etching operation is performed to remove the remaining layer of the substrate 10. In some embodiments, a metal layer, such as a Cu layer, is formed between the TMD layer 20 and the stamp layer 45. In such a case, a thickness of the Cu layer is in a range from about 200 nm to about 400 nm, and a thickness of the stamp layer 45 is in a range from about 400 nm to about 600 nm.

Figure 12E:
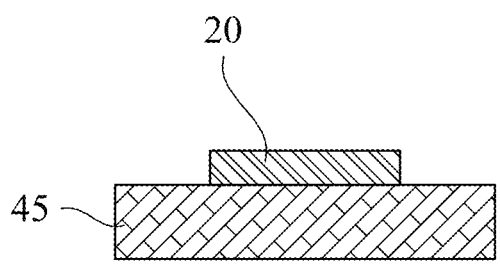

Then, as shown in FIG. 12E, the detached TMD layer 20 supported by the stamp layer 40 is transferred to a second substrate 45. Further, the stamp layer 45 is removed as shown in FIG. 12E. In some embodiments, wet etching is used to remove the stamp layer 45. For example, when the stamp layer 45 is made of an organic material, such as PMMA and PDMS, an organic solvent, such as acetone, can dissolve the organic material, thereby removing the stamp layer 45. When a Cu layer used, the Cu layer is removed by using FeNO$_3$ solution.

Subsequently, one or more lithography and etching operations are performed to trim the transferred TMD layer 20 to a desired size and shape.

After the TMD layer 20 is transferred to the second substrate 45 and an optional trimming process is performed, an FET is formed by the operations explained with respect to FIGS. 9A-11A.

FIGS. 13A-13C shows a sequential process for manufacturing a field effect transistor (FET) using a single crystalline TMD layer according to an embodiment of the present disclosure. It is understood that additional operations can be provided before, during, and after processes shown by FIGS. 13A-13C, and some of the operations described below can be replaced or eliminated, for additional embodiments of the method. The order of the operations/processes may be interchangeable. Materials, configurations, structures, operations and/or processes the same as or similar to the foregoing embodiments may be employed in this embodiment and the detailed explanation may be omitted.

As shown in FIG. 13A, one or more layers 12 of dielectric material is formed over a substrate 11. In some embodiments, the substrate 11 includes a single crystalline semiconductor layer on at least it surface portion. The substrate 11 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 11 is made of crystalline Si. The substrate 11 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 11. The germanium concentration of the SiGe buffer layers may increase from 30 atomic % germanium for the bottom-most buffer layer to 70 atomic % germanium for the top-most buffer layer. The substrate 11 may include various regions that have been suitably doped with impurities (e.g., p-type or n-type conductivity).

The dielectric layer 12 includes one or more of silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. In some embodiments, a planarization operation, such as a chemical mechanical polishing (CMP) method and/or an etch-back method, is performed.

Then, source/drain electrodes 26 are formed over the dielectric layer 12. The source/drain electrodes 25 include one or more layers of conductive material, such as, Au, Ag, Al, Cu, W, Co, Ni, Ti, Ta, TiN, TiAl, TiAlN, TaN, NiSi, CoSi, or other suitable conductive materials. In some embodiments, the source/drain electrodes 26 are embedded in the dielectric layer 12, by using a damascene technology. Grooves are formed in the surface of the dielectric layer 12, and one or more conductive material layers are formed in the grooves and the upper surface of the dielectric layer 12. Then, a chemical mechanical polishing (CMP) process is performed to remove excessive portion of the conductive material layers, thereby leaving the conductive material layers in the grooves.

Subsequently, as shown in FIG. 13B, a TMD single crystalline layer 20 is transferred over the source/drain electrode 20 and the dielectric layer 12, according to the transfer operations explained with respect to FIGS. 12A-12E. In some embodiments, after the TMD layer 20 is transferred, one or more lithography and etching operations are performed to pattern the TMD layer 20 into a desired shape.

Then, as shown in FIG. 13C, a gate dielectric layer 31 is formed over the TMD layer 20 and a gate electrode 36 is formed over the gate dielectric layer 31. In some embodiments, the gate dielectric layer 31 includes one or more layers of silicon oxide, silicon nitride, silicon oxy-nitride, or high-k dielectric materials. High-k dielectric materials comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the thickness of the gate dielectric layer 31 is in a range from about 1 nm to about 20 nm and is in a range from about 2 nm to about 10 nm in other embodiments. In some embodiments, the gate electrode layer 31 includes a single layer or a multilayer structure. The material for the gate dielectric layer 31 may be formed using a suitable process such as CVD, PVD, atomic layer deposition (ALD), or combinations thereof.

The gate electrode 36 includes doped poly-silicon with uniform or non-uniform doping concentration in some embodiments. In other embodiments, the gate electrode 36 includes a metal such as Al, Cu, W, Ti, CO, Ni, Ta, TiN, TiAl, TiAlN, TaN, NiSi, CoSi, and other conductive materials with a work function compatible with the substrate material, or combinations thereof. The electrode layer for the gate electrode 36 may be formed using a suitable process such as CVD, PVD, ALD, plating, or combinations thereof, and by using one or more lithography and etching operations, the gate electrode 36 is patterned.

FIGS. 14A-14C shows a sequential process for manufacturing a field effect transistor (FET) using a single crystalline TMD layer according to an embodiment of the present disclosure. It is understood that additional operations can be provided before, during, and after processes shown by FIGS. 14A-14C, and some of the operations described below can be replaced or eliminated, for additional embodiments of the method. The order of the operations/processes may be interchangeable. Materials, configurations, structures, operations and/or processes the same as or similar to the foregoing embodiments may be employed in this embodiment and the detailed explanation may be omitted. In the following embodiments, a back gate type FET is manufactured.

As shown in FIG. 14A, a gate electrode 37 is formed over a substrate 13, and a gate dielectric layer 32 is further formed over the gate electrode 37 and the substrate 13. In some embodiments, the substrate 13 is made of an insulating material, such as a glass plate. In other embodiments, the substrate 13 is a conductive substrate or a semiconductor substrate, on which one or more layers of insulating materials are formed, and the gate electrode 37 is formed on the insulating material layers.

The gate electrode 37 includes doped poly-silicon with uniform or non-uniform doping concentration in some embodiments. In other embodiments, the gate electrode 36 includes a metal such as Al, Cu, W, Ti, CO, Ni, Ta, TiN, TiAl, TiAlN, TaN, NiSi, CoSi, and other conductive materials with a work function compatible with the substrate material, or combinations thereof. The electrode layer for the gate electrode 36 may be formed using a suitable process such as CVD, PVD, ALD, plating, or combinations thereof, and by using one or more lithography and etching operations, the gate electrode 37 is patterned.

In some embodiments, the gate dielectric layer 32 includes one or more layers of silicon oxide, silicon nitride, silicon oxy-nitride, or high-k dielectric materials. High-k dielectric materials comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the thickness of the gate dielectric layer 31 is in a range from about 1 nm to about 20 nm and is in a range from about 2 nm to about 10 nm in other embodiments. In some embodiments, the gate dielectric layer 32 includes a single layer or a multilayer structure. The material for the gate dielectric layer 32 may be formed using a suitable process such as CVD, PVD, atomic layer deposition (ALD), or combinations thereof. In some embodiments, the gate electrode 37 is embedded in the insulating substrate 13 or the underlying insulating layer by using a damascene technology. Grooves are formed in the surface of the insulating substrate 13 or the underlying insulating layer, and one or more conductive material layers are formed in the grooves and the upper surface of the insulating substrate or the underlying insulating layer. Then, a chemical mechanical polishing (CMP) process is performed to remove excessive portion of the conductive material layers, thereby leaving the conductive material layers in the grooves.

Subsequently, as shown in FIG. 14B, a TMD single crystalline layer 20 is transferred over the source/drain electrode 20 and the dielectric layer 12, according to the transfer operations explained with respect to FIGS. 12A-12E. In some embodiments, after the TMD layer 20 is transferred, one or more lithography and etching operations are performed to pattern the TMD layer 20 into a desired shape.

Subsequently, as shown in FIG. 14B, a TMD single crystalline layer 20 is transferred over the gate dielectric layer 32, according to the transfer operations explained with respect to FIGS. 12A-12E. In some embodiments, after the TMD layer 20 is transferred, one or more lithography and etching operations are performed to pattern the TMD layer 20 into a desired shape.

Then, as shown in FIG. 14C, source/drain electrodes 27 are formed over the TMD layer 20. The source/drain electrodes 27 include one or more layers of conductive material, such as, Au, Ag, Al, Cu, W, Co, Ni, Ti, Ta, TiN, TiAl, TiAlN, TaN, NiSi, CoSi, or other suitable conductive materials.

The various embodiments or examples described herein offer several advantages over the existing art. For example, in the present disclosure, by using a nucleation pattern and a C-2 symmetric crystalline substrate, it is possible to obtain a large area single crystalline layer of a TMD material. Further, since the location of the nucleation is controlled by the nucleation pattern, it is possible to selectively grow a single crystalline layer of TMD at the desired location. When the substrate is (110) Si, it is possible to fabricate electronic devices, such as an FET, without using a film transfer operation, thereby reducing manufacturing cost.

It will be understood that not all advantages have been necessarily discussed herein, no particular advantage is required for all embodiments or examples, and other embodiments or examples may offer different advantages.

According to one aspect of the present disclosure, in a method of forming a two-dimensional material layer, a nucleation pattern is formed over a substrate, and a transition metal dichalcogenide (TMD) layer is formed such that the TMD layer laterally grows from the nucleation pattern. In one or more of the foregoing and following embodiments, the TMD layer is single crystalline. In one or more of the foregoing and following embodiments, the nucleation pattern is formed by forming a film over the substrate, and patterning the film into a line pattern. In one or more of the foregoing and following embodiments, the film is made of metal or metal oxide. In one or more of the foregoing and following embodiments, the film is made of Mo or $MoO_3$. In one or more of the foregoing and following embodiments, the substrate is a single crystal, and an upper surface of the substrate on which the nucleation pattern is formed is asymmetry to TMD layer. In one or more of the foregoing and following embodiments, the substrate is one of Si, $\gamma$-$Al_2O_3$, $Ga_2O_3$ and MgO, of which upper surface has $C_2$ symmetry nucleation pattern, or a composite substrate comprising a layer of h-BN or graphene substrate deposited on top of a $C_3$ symmetry substrate including SiC (0001), Ge (111), Si (111), Cu (111) or Pt (111). In one or more of the foregoing and following embodiments, the substrate is (110) Si. In one or more of the foregoing and following embodiments, the nucleation pattern extends along a direction corresponding to (001). In one or more of the foregoing and following embodiments, the nucleation pattern is a groove. In one or more of the foregoing and following embodiments, the TMD layer includes $MX_2$, where M is one of Mo, W, Pd, Pt and Hf and X is one of S, Se and Te. In one or more of the foregoing and following embodiments, the TMD layer includes $MoS_2$. In one or more of the foregoing and following embodiments, the $MoS_2$ layer is formed by a chemical vapor deposition method. In one or more of the foregoing and following embodiments, an intermediate layer is formed over the substrate. In one or more of the foregoing and following embodiments, the intermediate layer is a BN layer or a graphene layer.

In accordance with another aspect of the present application, in a method of fabricating a field effect transistor, a nucleation pattern is formed over a substrate. A TMD layer is formed such that the TMD layer laterally grows from the nucleation pattern. After the TMD layer is formed, the nucleation pattern is removed. Source and drain electrodes are formed on the TMD layer. A gate dielectric layer is formed. A gate electrode is formed over the gate dielectric layer. In one or more of the foregoing and following embodiments, the TMD layer is a $MoS_2$ single crystalline layer. In one or more of the foregoing and following embodiments, the substrate is (110) silicon, and the nucleation pattern extends along a direction corresponding to (001).

In accordance with another aspect of the present application, in a method of fabricating a field effect transistor, a plurality of nucleation patterns are formed over a substrate. A plurality regions of a transition metal dichalcogenide (TMD) layer are formed from edges of the plurality of nucleation patterns, respectively. Source and drain electrodes are formed over each of the plurality of regions of the TMD layer. A gate dielectric layer is formed over the plurality of regions of the TMD layer. Gate electrodes are formed over the gate dielectric layer over each of the plurality of regions of the TMD layer. In one or more of the foregoing and following embodiments, the substrate is (110) silicon, and the plurality of nucleation patterns extend along a direction corresponding to (001).

In accordance with another aspect of the present application, in a method of fabricating a field effect transistor, a nucleation pattern is formed over a first substrate. A transition metal dichalcogenide (TMD) layer is formed such that the TMD layer laterally grows from the nucleation pattern. The TMD layer is detached from the first substrate and attaching the detached TMD layer to a second substrate. In one or more of the foregoing and following embodiments, the TMD layer is single crystalline. In one or more of the foregoing and following embodiments, the nucleation pattern is formed by forming a film over the first substrate, and patterning the film into a line pattern. In one or more of the foregoing and following embodiments, the substrate is one of Si, $\gamma$-$Al_2O_3$, $Ga_2O_3$ and MgO, of which upper surface is (110) or has a $C_2$ symmetric nuclear pattern. In one or more of the foregoing and following embodiments, a source/drain electrode is formed over the second substrate. In one or more of the foregoing and following embodiments, the source/drain electrode is embedded in an insulating layer formed over the second substrate. In one or more of the foregoing and following embodiments, after the detached TMD layer is attached to the second substrate, a gate dielectric layer is formed over the TMD layer, and a gate electrode is formed over the gate dielectric layer. In one or more of the foregoing and following embodiments, a gate electrode covered by a gate dielectric layer is formed over the second substrate. In one or more of the foregoing and following embodiments, the gate electrode is embedded in an insulating material. In one or more of the foregoing and following embodiments, after the detached TMD layer is attached to the second substrate a gate dielectric layer is formed over the gate electrode, and a source/drain electrode is formed over the gate dielectric layer.

In accordance with one aspect of the present disclosure, a field effect transistor (FET) includes a two-dimensional transition metal dichalcogenide (2D-TMD) layer as a channel, source/drain electrode, a gate dielectric layer, and a gate electrode. The 2D-TMD layer is single crystalline without grain boundaries. In some embodiments, the TMD layer includes $MoS_2$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a two-dimensional material layer, the method comprising:
    forming a nucleation pattern over a substrate, the nucleation pattern being a groove; and
    forming a transition metal dichalcogenide (TMD) layer such that the TMD layer laterally grows from the nucleation pattern.

2. The method of claim 1, wherein the TMD layer is single crystalline.

3. The method of claim 1, wherein:
    the substrate is a single crystal, and
    an upper surface of the substrate on which the nucleation pattern is formed is asymmetry to TMD layer.

4. The method of claim 3, wherein the substrate is one of Si, $\gamma$-$Al_2O_3$, $Ga_2O_3$ and MgO, of which upper surface has a $C_2$ symmetry nucleation pattern, or a composite substrate comprising a layer of h-BN or graphene substrate deposited on top of a $C_3$ symmetry substrate including SiC (0001), Ge (111), Si (111), Cu (111) or Pt (111).

5. The method of claim 3, wherein the substrate is (110) Si.

6. The method of claim 3, wherein the nucleation pattern extends along a direction corresponding to (001).

7. The method of claim 1, wherein the TMD layer includes $MX_2$, where M is one of Mo, W, Pd, Pt and Hf and X is one of S, Se and Te.

8. The method of claim 1, wherein the TMD layer includes $MoS_2$.

9. The method of claim 8, wherein the $MoS_2$ layer is formed by chemical vapor deposition.

10. A method of fabricating a field effect transistor, comprising:
    forming a nucleation pattern over a substrate;
    forming a transition metal dichalcogenide (TMD) layer such that the TMD layer laterally grows from the nucleation pattern;

after the TMD layer is formed, removing the nucleation pattern, wherein:

the substrate is (110) silicon, and the nucleation pattern extends along a direction corresponding to (001).

11. The method of claim 10, wherein the TMD layer is a $MoS_2$ single crystalline layer.

12. The method of claim 10, wherein the nucleation pattern is formed by:

forming a film over the substrate; and patterning the film into a line pattern.

13. The method of claim 12, wherein the film is made of metal or metal oxide.

14. The method of claim 12, wherein the film is made of Mo or $MoO_3$.

15. The method of claim 10, wherein the nucleation pattern is a groove.

16. A method of fabricating a field effect transistor, comprising:

forming a nucleation pattern over a first substrate;

forming a transition metal dichalcogenide (TMD) layer such that the TMD layer laterally grows from the nucleation pattern;

forming one or more first electrodes over a second substrate;

transferring the TMD layer from the first substrate to the second substrate so that the TMD layer covers the one or more first electrodes;

forming a gate dielectric layer over the second substrate; and forming one or more second electrodes over the TMD layer.

17. The method of claim 16, wherein:

the one or more first electrodes comprise a source electrode and a drain electrode, the gate dielectric layer is formed over the TMD layer, and the one or more second electrodes comprise a gate electrode formed on the gate dielectric layer.

18. The method of claim 16, wherein:

the one or more first electrodes comprise a gate electrode, the gate dielectric layer is formed over the gate dielectric layer and the TMD layer is formed over the gate dielectric layer, and the one or more second electrodes comprise a source electrode and a drain electrode formed on the TMD layer.

19. The method of claim 16, wherein the nucleation pattern is made of one of Mo, W, Pd or Hf or oxide thereof.

20. The method of claim 16, wherein the nucleation pattern is a groove.

* * * * *